US011251343B2

(12) United States Patent
He et al.

(10) Patent No.: US 11,251,343 B2
(45) Date of Patent: Feb. 15, 2022

(54) LED DESIGN OF LOWER CCT UTILIZING PFS PHOSPHOR

(71) Applicant: Current Lighting Solutions, LLC, East Cleveland, OH (US)

(72) Inventors: Jianmin He, Orange, OH (US); Kevin James Vick, Cleveland Heights, OH (US)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 49 days.

(21) Appl. No.: 15/428,077

(22) Filed: Feb. 8, 2017

(65) Prior Publication Data

US 2018/0226545 A1 Aug. 9, 2018

(51) Int. Cl.
*H01L 33/50* (2010.01)
*C09K 11/77* (2006.01)
*C09K 11/61* (2006.01)

(52) U.S. Cl.
CPC .......... *H01L 33/504* (2013.01); *C09K 11/617* (2013.01); *C09K 11/7774* (2013.01)

(58) Field of Classification Search
CPC ....... H01L 33/504; H01L 33/62; H01L 33/32; H01L 33/486; C09K 11/617; C09K 11/7774
See application file for complete search history.

(56) References Cited

U.S. PATENT DOCUMENTS

| | | | |
|---|---|---|---|
| 7,358,542 B2 | 4/2008 | Radkov et al. | |
| 7,648,649 B2 | 1/2010 | Radkov et al. | |
| 2004/0000862 A1* | 1/2004 | Setlur | C09K 11/7706 313/501 |
| 2007/0241657 A1* | 10/2007 | Radkov | C09K 11/0883 313/483 |
| 2011/0025183 A1* | 2/2011 | Su | H01L 25/0753 313/1 |

(Continued)

FOREIGN PATENT DOCUMENTS

| | | |
|---|---|---|
| JP | 2012-060179 A | 3/2012 |
| JP | 2016-063001 A | 4/2016 |

(Continued)

OTHER PUBLICATIONS

International Search Report and Written Opinion issued in connection with corresponding PCT Application No. PCT/US2018/012442 dated Apr. 27, 2018.

(Continued)

*Primary Examiner* — Fernando L Toledo
*Assistant Examiner* — Neil R Prasad
(74) *Attorney, Agent, or Firm* — Buckley, Maschoff & Talwalkar LLC

(57) ABSTRACT

An LED assembly includes an LED light source having a first light output with a characteristic spectrum, and a yellow-green phosphor, red phosphor, and neodymium fluorine absorber combination through which the first light output passes, wherein the yellow-green phosphor, red phosphor, and neodymium fluorine absorber combination is configured to convert the first light output to a second light output having a predetermined correlated color temperature.

21 Claims, 5 Drawing Sheets

(56) References Cited

U.S. PATENT DOCUMENTS

| | | | |
|---|---|---|---|
| 2011/0255265 A1* | 10/2011 | Nammalwar | C09K 11/0883 |
| | | | 362/84 |
| 2012/0068591 A1* | 3/2012 | Kim | C09K 11/0883 |
| | | | 313/484 |
| 2012/0161170 A1 | 6/2012 | Dubuc et al. | |
| 2012/0298950 A1* | 11/2012 | Basceri | H01L 33/005 |
| | | | 257/13 |
| 2014/0239228 A1 | 8/2014 | Ishizawa | |
| 2016/0097496 A1 | 4/2016 | Allen et al. | |
| 2016/0356435 A1 | 12/2016 | Dudik et al. | |

FOREIGN PATENT DOCUMENTS

| | | |
|---|---|---|
| KR | 10-2016-0027432 A | 3/2016 |
| WO | 2015/035425 A1 | 3/2015 |
| WO | 2015035425 A1 | 3/2015 |
| WO | 2016/039800 A1 | 3/2016 |
| WO | 2016/039817 A1 | 3/2016 |
| WO | 2016057604 A1 | 4/2016 |

OTHER PUBLICATIONS

Korean Office Action dated Aug. 5, 2020 which was issued in a counterpart application KR 10-2019-7026323.
Search Report Issued in connection with corresponding European Application No. 18750585.4 dated Oct. 22, 2020.

\* cited by examiner

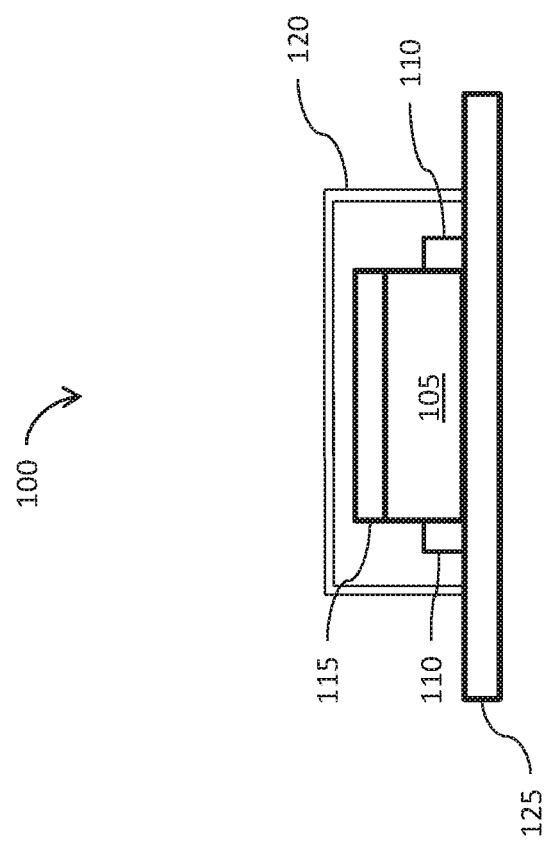

LED DESIGN OF LOWER CCT UTILIZING PFS PHOSPHOR

FIELD

The disclosed exemplary embodiments relate generally to lighting systems, and more particularly to light emitting diode (LED) lighting systems.

BACKGROUND

LED lighting technology continues to advance resulting in improved efficiencies and lower costs. LED light sources are found in lighting applications ranging from small pin point sources to stadium lights. An LED is typically a semiconductor light emitter, and may be referred to as an LED chip. The color of light produced by an LED chip may be dependent on the type of semiconducting material used in its manufacture. LED chips with various emission colors may be produced from Group III-V alloys such as gallium nitride (GaN). GaN-based LED chips can be chemically tuned to emit light in the UV or blue range of the electromagnetic spectrum. One technique for converting the light emitted from an LED chip to white light includes using luminescent materials that convert a portion of the light in the UV or blue range spectrum to lights of other colors including green, yellow and red, all of which further blend and become white light. Exemplary luminescent materials include phosphors that emit radiation in the visible portion of the electromagnetic spectrum in response to excitation by electromagnetic radiation in the UV or blue range. An LED chip with one or more luminescent materials may be referred to as an LED assembly.

At least one type of white light emitting LED assembly includes a blue emitting InGaN chip coated with a phosphor or blend of phosphors that converts some of the blue radiation to a complimentary color, for example, a yellow-green emission or a combination of yellow-green and red emission. The blue, yellow-green, and red radiation together produce a white light. A white LED assembly may also be constructed of a UV emitting chip and a phosphor blend including red, green and blue emitting phosphors designed to convert the UV radiation to visible light. The LED assembly may be constructed so that the light output has certain characteristics, such as particular Correlated Color Temperature (CCT), Color Rendering Index (CRI), and Lighting Preference Index (LPI). LPI is a color metric that enables quantitative optimization of color preference by tailoring the spectral power distribution of the light source as disclosed in PCT/US2014/054868, filed Sep. 9, 2014 and published as WO 2015/035425, incorporated by reference herein in its entirety.

Red-emitting fluoride phosphor activated by $Mn^{4+}$, such as those described in U.S. Pat. Nos. 7,358,542 and 7,648,649, can be utilized in combination with yellow or green phosphors such as YAG:Ce or other garnet compositions to achieve warm white light (CCTs<5000 K near the blackbody locus) when combined with a blue LED. These red phosphor materials absorb blue light and efficiently emit in a narrow range between about 610-635 nm with little deep red/near infrared emission at longer wavelengths (>650 nm). Therefore, luminous efficacy is maximized compared to red phosphors with a broad emission spectrum that have significant emission in the deeper red where eye sensitivity is very low. In general, the lower the targeted CCT for the LED chip package, the more red phosphor is required. However, due to its relatively poorer absorbability compared to other alternative red phosphors, the amount of red fluoride phosphor such as $K_2SiF_6$:Mn required to achieve a desired lower CCT such as 2700K, and a specific LPI, such as greater than 110, is dramatically increased and may be limited by both LED chip package size and cost. Thus, there is a need for a luminescent material that provides a desired CCT and LPI within present and future package size and cost constraints.

Accordingly, it would be desirable to provide an LED assembly design that addresses at least some of the problems identified above.

SUMMARY

As described herein, the exemplary embodiments overcome one or more of the above or other disadvantages known in the art.

The aspects of the disclosed embodiments are directed to an LED assembly. In one embodiment, the LED assembly includes an LED light source having a first light output with a characteristic spectrum, and a yellow-green phosphor, red phosphor, and neodymium fluorine absorber combination through which the first light output passes, wherein the yellow-green phosphor, red phosphor, and neodymium fluorine absorber combination is configured to convert the first light output to a second light output having a predetermined correlated color temperature.

The yellow-green phosphor, red phosphor, and neodymium fluorine absorber combination may be configured to provide the second light output with a particular Lighting Preference Index.

The yellow-green phosphor, red phosphor, and neodymium fluorine absorber combination may be configured to provide the second light output with a Lighting Preference Index of at least 110.

The yellow-green phosphor, red phosphor, and neodymium fluorine absorber combination may be configured to provide the second light output with a Lighting Preference Index of at least 120.

The neodymium fluoride absorber may be configured to attenuate a yellow light emission to provide the second light output with the particular Lighting Preference Index.

The yellow-green phosphor, red phosphor, and neodymium fluorine absorber combination may be configured to provide the second light output with chromaticity color coordinates below a black body locus.

The LED light source may include one or more of a blue LED or a violet LED.

The yellow-green phosphor may include a garnet phosphor.

The garnet phosphor may include a yttrium aluminum garnet phosphor.

The garnet phosphor may include a yttrium aluminum garnet phosphor activated by cerium.

The red phosphor may include a manganese-doped potassium fluoro-silicate phosphor.

The neodymium fluorine absorber may include $NdF_3$.

The neodymium fluorine absorber may include a combination of $NdF_3$ and another neodymium compound.

The neodymium fluorine absorber may include a combination of $NdF_3$ and NdOF.

The neodymium fluorine absorber may include a combination of $NdF_3$ and $Nd_2O_3$.

The neodymium fluorine absorber may be configured to absorb yellow light in a range of approximately 560-610 nm.

The yellow-green phosphor, red phosphor, and neodymium fluorine absorber combination may include a yellow-green phosphor and red phosphor portion proximate the LED light source and a neodymium fluorine absorber portion spaced apart from the LED light source.

Additional aspects of the disclosed embodiments are directed to an LED assembly including an LED light source having a first light output with a characteristic spectrum, and a yellow-green and red phosphor combination that converts the first light output to a second light output with a first correlated color temperature and a first Lighting Preference Index, wherein an addition of neodymium fluorine absorber to the yellow-green and red phosphor combination results in a third light output with a second correlated color temperature lower than the first correlated color temperature and a second Lighting Preference Index higher than the first Lighting Preference Index.

The first correlated color temperature may be approximately 4000K, the first Lighting Preference Index may be approximately 111, the second correlated color temperature may be approximately 3500K, and the second Lighting Preference Index may be approximately 128.

The correlated color temperature may be approximately 3350K, the first Lighting Preference Index may be approximately 107, the second correlated color temperature may be approximately 3000K, and the second Lighting Preference Index is approximately 120.

The first correlated color temperature is approximately 3050K, the first Lighting Preference Index is approximately 109, the second correlated color temperature is approximately 2755K, and the second Lighting Preference Index is approximately 120.

The yellow-green phosphor, red phosphor, and neodymium fluorine absorber combination may provide the third light output with chromaticity color coordinates below the black body locus in the CIE 1931 color space chromaticity diagram.

The yellow-green phosphor may include between 0.3 and 0.7 mg of yttrium aluminum garnet phosphor activated by cerium.

The red phosphor may include between 1.0 and 2.0 mg of manganese-doped potassium fluoro-silicate phosphor.

The neodymium fluorine absorber combination may include between 0.05 and 0.15 mg of neodymium fluoride.

Further aspects of the disclosed embodiments are directed to an LED assembly including an LED light source having a first light output with a characteristic spectrum and a yellow-green phosphor, red phosphor, and neodymium fluorine absorber combination through which the first light output passes, wherein the yellow-green phosphor, red phosphor, and neodymium fluorine absorber combination is configured to convert the first light output to a second light output having a Lighting Preference Index greater than 110 and a correlated color temperature between 4000K-2700K.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

The accompanying drawings illustrate presently preferred embodiments of the present disclosure, and together with the general description given above and the detailed description given below, serve to explain the principles of the present disclosure. As shown throughout the drawings, like reference numerals designate like or corresponding parts.

FIG. 1A shows an LED assembly according to the disclosed embodiments;

DETAILED DESCRIPTION OF THE DISCLOSED EMBODIMENTS

Figure 1B:
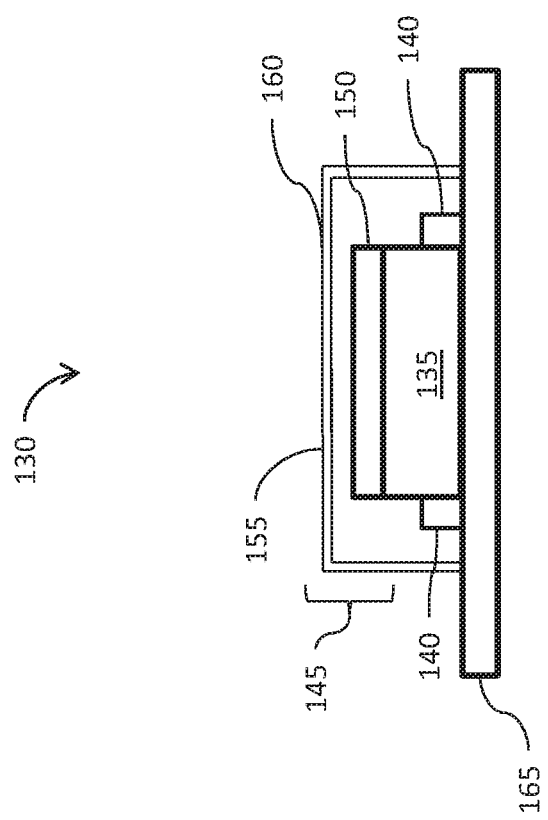
FIG. 1B shows another LED assembly according to the disclosed embodiments.

As described herein, the exemplary embodiments overcome one or more of the above or other disadvantages known in the art.

The aspects of the disclosed embodiments provide an LED light assembly that advantageously provides a desired CCT and a Lighting Preference Index (LPI) by using a novel composition of a yellow, green, or combination yellow and green phosphor, a red phosphor, and a compound including neodymium and fluorine configured to provide a desired light spectrum by filtering light generated by an LED light source.

FIG. 1A shows an exemplary LED assembly 100 according to the disclosed embodiments. The LED assembly may include a semiconductor UV or blue radiation source, such as a light emitting diode (LED) chip 105 and leads 110 electrically attached to the LED chip. The leads 110 may provide power to the LED chip 105 that may cause the LED chip 105 to emit radiation.

The LED assembly 100 may include any semiconductor blue or UV light source that is capable of producing white light when its emitted radiation is directed through a luminescent material 115. In at least one embodiment, the semiconductor light source may include a blue emitting LED chip doped with various impurities. For example, the LED chip 105 may have at least one semiconductor layer including GaN, ZnSe or SiC. In some embodiments, the LED chip may be a UV or blue emitting LED having a peak emission wavelength from about 400 to about 470 nm.

The LED chip 105 may be encapsulated within a shell 120 which encloses the LED chip. The shell 120 may be made of, for example, a glass or plastic material and may be transparent or substantially optically transmissive with respect to wavelengths of light produced by the LED chip 105 and the luminescent material 115. The LED chip 105 and the shell 120 may be mounted on a substrate 125.

According to some of the disclosed embodiments, the luminescent material 115 may include a yellow, green, or a combination of yellow and green phosphor. For purposes of the disclosed embodiments, the yellow, green, or combination of yellow and green phosphor may be referred to as a yellow-green phosphor. For purposes of the disclosed embodiments, a garnet phosphor may also be considered a yellow-green phosphor. The luminescent material may also include a red phosphor, and neodymium fluoride ($NdF_3$). It has been unexpectedly discovered that adding a compound including neodymium and fluorine, for example, $NdF_3$ or a combination of $NdF_3$ and any neodymium compound, such as NdOF or $Nd_2O_3$, to various combinations of yellow-green and red phosphors causes the light output to shift toward lower CCTs, a higher chromaticity x coordinate (CCx), and a higher LPI. In general, a neodymium compound, such as $NdF_3$, NdOF, or $Nd_2O_3$ may cause an increase in LPI, while $NdF_3$ may specifically cause a shift toward lower CCTs. In one aspect, the compound including neodymium and fluorine, also referred to as the neodymium fluorine compound, operates as an absorber to attenuate a yellow portion of the color spectrum resulting in an improved LPI. The neodymium fluorine compound operating as an absorber may be referred to as a neodymium fluorine absorber. In some embodiments, the addition of the neodymium fluorine absorber may allow for a reduction in an amount of red phosphor required to achieve lower CCTs and higher LPI values.

FIG. 1B shows another exemplary LED assembly 130 according to the disclosed embodiments. A semiconductor UV or blue radiation source, such as a light emitting diode (LED) chip 135 may be included and power may be supplied to the LED chip through electrically attached leads 140, causing the LED chip 135 to emit radiation.

Similar to the embodiment shown in FIG. 1A, the LED assembly 130 may include any semiconductor blue or UV light source that is capable of producing white light when its emitted radiation is directed through a luminescent material 145. According to at least some of the disclosed embodiments, the luminescent material 145 may include a first portion 150 proximate the LED chip 135 and a second portion 155 spaced apart from the LED chip 135, for example, located or deposited on a shell 160 enclosing the LED chip 135. In at least one embodiment, the first portion 150 may include the yellow-green and red phosphors, while the second portion 155 may include the neodymium fluorine absorber. It should be understood that in some embodiments, the first and second portions may be located in any suitable position as long as light from the LED chip 135 passes through the first portion 150, and then through the second portion 155. For the purposes of the disclosed embodiments, the combination of a yellow-green phosphor, a red phosphor, and the neodymium fluorine absorber refers to the luminescent material 115 as implemented in FIG. 1A as well as the luminescent material 145 as implemented in FIG. 1B.

The shell 160 may be made of, for example, a glass or plastic material and may be transparent or substantially optically transmissive with respect to wavelengths of light produced by the LED chip 135 and the first portion of luminescent material 150. A substrate 165 may support the LED chip 135 and the shell 160.

The following examples shown in FIGS. 2A, 2B, 3A, 3B, 4A, and 4B illustrate the impact of adding the neodymium fluorine absorber to a yellow-green and red phosphor combination to produce the luminescent material 115. The following illustrative examples utilize yttrium aluminum garnet phosphor activated by cerium (YAG:Ce) and manganese-doped potassium fluoro-silicate ($K_2SiF_6:Mn^{4+}$ or "PFS") phosphor, however, it should be understood that the disclosed embodiments may utilize another suitable garnet phosphor or any suitable yellow, green or yellow-green phosphor, and may utilize any suitable red phosphor.

Figure 2B:
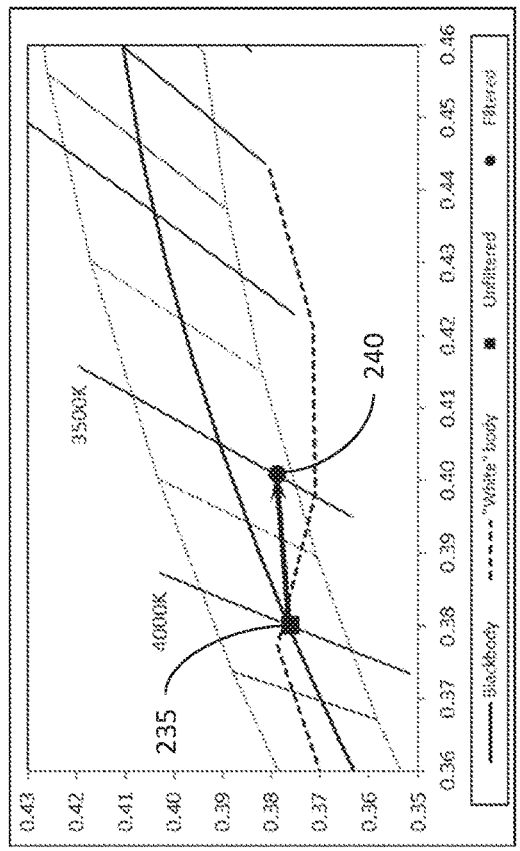
FIGS. 2A, 2B, 3A, 3B, 4A, and 4B illustrate an impact of adding a neodymium fluorine absorber to a garnet and red phosphor combination to produce a desirable spectrum power distribution (SPD), CCT and LPI for the LED assembly.
Figure 2A:
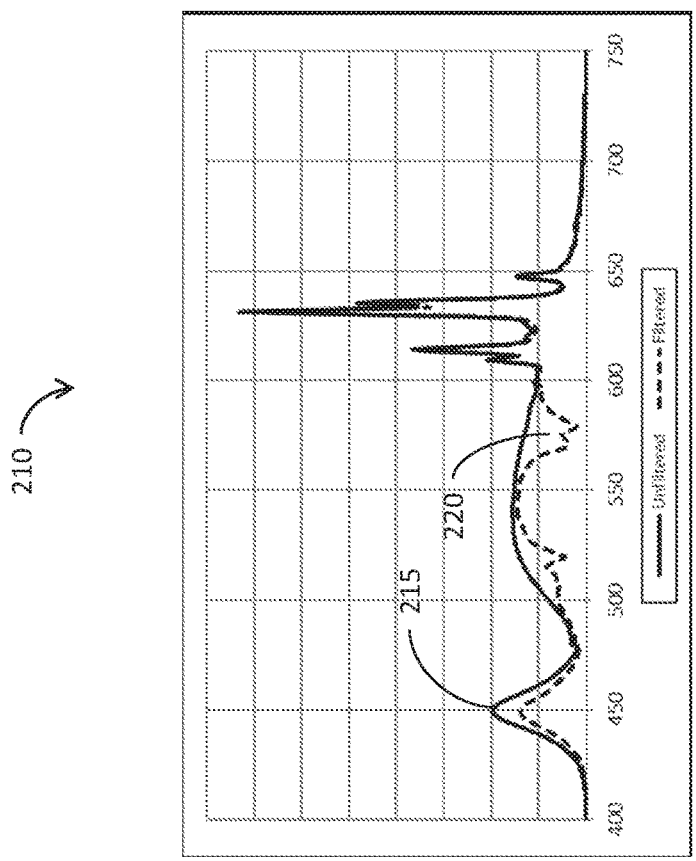

FIG. 2A shows a spectrum plot 210 illustrating a comparison between two spectrums 215, 220, without and with the addition of the neodymium fluorine absorber, respectively. Spectrum 215 represents the output of an LED assembly with a YAG and PFS combination that results in a CCT of 4000K, a 0.000 $D_{uv}$ (on the black body locus), a Color Rendering Index (CRI) of 90, and an LPI of 111. Spectrum 220 represents the output of an LED assembly with the neodymium fluorine absorber added to the identical YAG PFS combination. The addition of the neodymium fluorine absorber to the YAG and PFS combination causes attenuation in the 560-600 nm range.

FIG. 2B shows a chromaticity diagram 230 illustrating changes due to the addition of the neodymium fluorine absorber. Color points 235 and 240 show that the addition of the neodymium fluorine absorber to the YAG and PFS combination results in a CCT shift from 4000K to 3500K, and from 0.000 $D_{uv}$ to −0.004 $D_{uv}$. The PFS, YAG, and neodymium fluorine absorber combination results in a chromaticity color point 240 below the black body locus in the CIE 1931 color space chromaticity diagram. The data from the spectrum plot 210 and the chromaticity diagram 230 may be used to determine that the addition of the neodymium fluorine absorber also results in a CRI of 81, and an increased LPI from 111 to 128, with a tradeoff of additional 24% lumen loss.

Figure 3B:
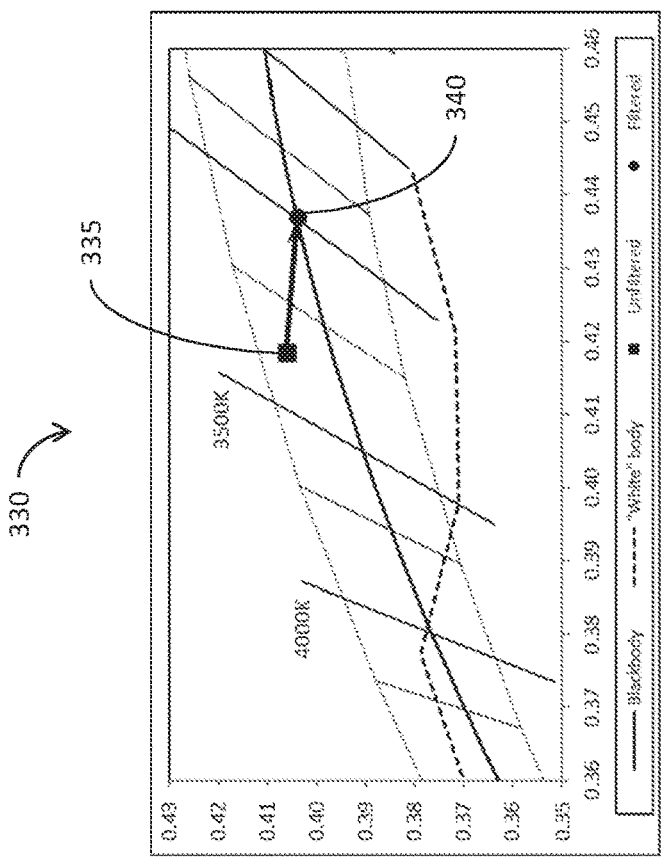
Figure 3A:
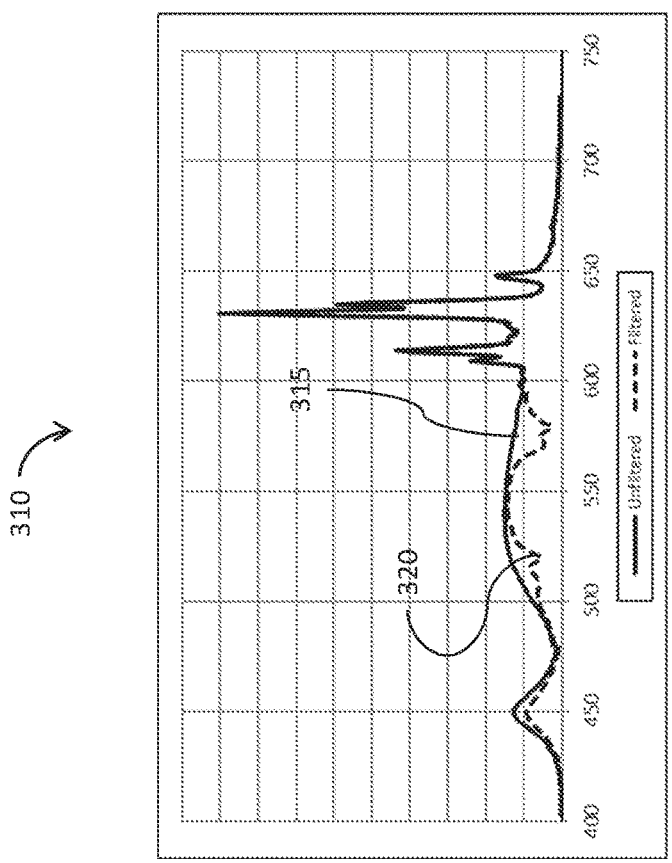

FIG. 3A shows a spectrum plot 310 illustrating another comparison between two spectrums 315, 320, without and with the addition of the neodymium fluorine absorber, respectively. Spectrum 315 represents the output of an LED assembly with a YAG PFS combination that results in a CCT of 3350K, a +0.004 $D_{uv}$ (above the black body locus), a Color Rendering Index (CRI) of 90, and an LPI of 107. Spectrum 320 represents the output of an LED assembly with the neodymium fluorine absorber added to the YAG PFS combination. The addition of the neodymium fluorine absorber to the YAG and PFS combination causes attenuation in the 560-600 nm range, as mentioned above.

FIG. 3B shows a chromaticity diagram 330 illustrating changes due to the addition of the neodymium fluorine absorber. Color points 335 and 340 show that the addition of the neodymium fluorine absorber to the YAG and PFS combination results in a CCT shift from 3350K to 3000K, and from +0.004 $D_{uv}$ to 0.000 $D_{uv}$. The PFS, YAG, and neodymium fluorine absorber combination reduces the y value of the chromaticity color point 340 so that the chromaticity color point 340 may fall on or just below the black body locus. The data from the spectrum plot 310 and the chromaticity diagram 330 may be used to determine that the addition of the neodymium fluorine absorber also results in a CRI of 80, and an increased LPI of 120, within an acceptable 20% lumen loss.

Figures 4A, 4B:
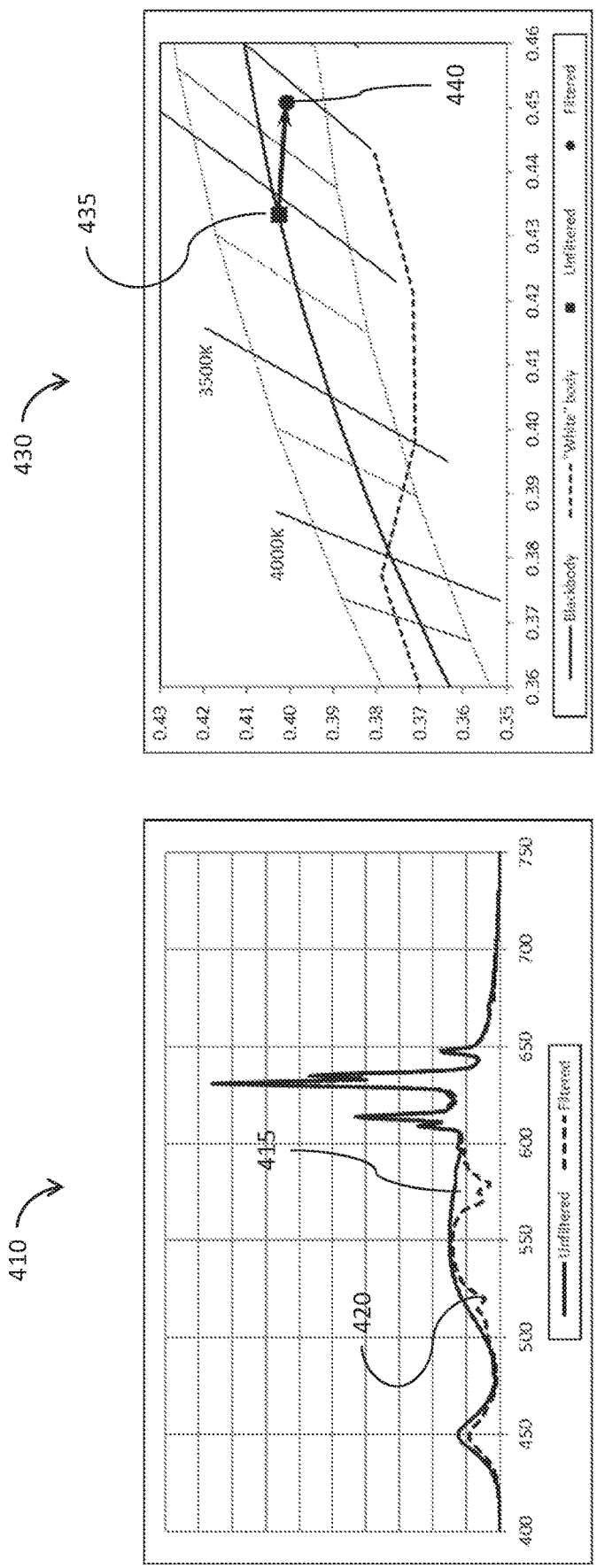

FIG. 4A shows yet another spectrum plot 410 illustrating yet another comparison between two spectrums 415, 420, without and with the addition of the neodymium fluorine absorber, respectively. Spectrum 415 represents the output of an LED assembly with a YAG PFS combination that results in a CCT of 3050K, a 0.000 $D_{uv}$ (on the black body locus), a Color Rendering Index (CRI) of 90, and an LPI of 109. Spectrum 420 represents the output of the LED assembly with the neodymium fluorine absorber added to the YAG PFS combination and, with the other examples, the addition of the neodymium fluorine absorber to the YAG and PFS combination causes attenuation in the 560-600 nm range.

FIG. 4B shows a chromaticity diagram 430 illustrating changes to the output of the exemplary LED assembly due to the addition of the neodymium fluorine absorber. Color points 435 and 440 show that the addition of the neodymium fluorine absorber to the YAG and PFS combination results in a CCT shift from 3050K to 2755K, and from 0.000 $D_{uv}$ to −0.003 $D_{uv}$. The PFS, YAG, and neodymium fluorine absorber combination in this embodiment results in a chromaticity color point 440 below the black body locus. The data from the spectrum plot 410 and the chromaticity diagram 430 may be used to determine that the addition of the neodymium fluorine absorber also results in a CRI of 84, and an increase in the LPI from 109 to 120, within an acceptable 20% lumen loss.

The amount of each of the phosphors and the neodymium fluorine absorber utilized may vary depending on the spectral characteristics of the LED chip, the exact chemical composition and characteristics of each phosphor especially those of quantum efficiency and absorbability at excitation wavelength, and the desired characteristics of the light output. The relative proportions of the phosphors and the neodymium fluorine absorber in the various embodiments may be adjusted such that when employed in an LED assembly, a visible light having predetermined x and y values on the CIE chromaticity diagram is produced with an LPI of at least approximately 120. In some embodiments, the amounts and composition of each phosphor and the amount of the neodymium fluorine absorber may be varied to achieve a particular CCT and LPI. For example, a combination of a garnet phosphor, a red phosphor, and a neodymium fluorine absorber may result in a Lighting Preference Index of greater than 110, and preferably greater than 120, a CCT of between 4000K-2700K and chromaticity color coordinates below the black body locus in the CIE 1931 color space chromaticity diagram.

Table 1 shows various exemplary ranges of amounts of phosphors and neodymium fluorine absorber for achieving particular CCT values, where the red phosphor is PFS, the garnet phosphor is YAG:Ce, and the neodymium fluorine absorber is $NdF_3$.

TABLE 1

| CCT | PFS (mg) | YAG:Ce (mg) | $NdF_3$ (mg) |
| --- | --- | --- | --- |
| 3500K | 1.5-2 | 0.5-0.7 | 0.05-0.15 |
| 4000K | 1-1.5 | 0.3-0.5 | 0.05-0.1 |
| 5000K | 0.5-1 | 0.1-0.4 | 0.02-0.07 |

The phosphors and $NdF_3$ may be utilized in any suitable form, for example, a powdered form, and may be combined and deposited onto the LED chip 135 or may be selectively deposited onto the LED chip 135 and shell 160 using any suitable method.

Various modifications and adaptations may become apparent to those skilled in the relevant arts in view of the foregoing description, when read in conjunction with the accompanying drawings. However, all such and similar modifications of the teachings of the disclosed embodiments will still fall within the scope of the disclosed embodiments.

Various features of the different embodiments described herein are interchangeable, one with the other. The various described features, as well as any known equivalents can be mixed and matched to construct additional embodiments and techniques in accordance with the principles of this disclosure.

Furthermore, some of the features of the exemplary embodiments could be used to advantage without the corresponding use of other features. As such, the foregoing description should be considered as merely illustrative of the principles of the disclosed embodiments and not in limitation thereof.

What is claimed is:

1. An LED assembly, comprising:
   an LED light source having a first light output with a characteristic spectrum; and
   a yellow-green and red phosphor combination deposited on a top surface of the LED light source, wherein the combination converts the first light output to a second light output with a first correlated color temperature and a first Lighting Preference Index;
   wherein an addition of neodymium fluorine absorber in a powdered form to the yellow-green and red phosphor combination and deposited onto the LED light source forms a yellow-green phosphor, red phosphor, and neodymium fluorine absorber combination and results in a third light output with a second correlated color temperature lower than the first correlated color temperature, the second correlated color temperature in the range of 4000 K to 2700 K,
   and a second Lighting Preference Index of at least 110 and higher than the first Lighting Preference Index,
   the third light output with chromaticity color coordinates below a black body locus in the CIE 1931 color space chromaticity diagram.

2. The LED assembly of claim 1, wherein the yellow-green phosphor, red phosphor, and neodymium fluorine absorber combination is configured to provide the third light output with a Lighting Preference Index of at least 120.

3. The LED assembly of claim 1, wherein the neodymium fluoride absorber is configured to attenuate a yellow light emission to provide the second light output with the particular Lighting Preference Index.

4. The LED assembly of claim 1, wherein the LED light source comprises one or more of a blue LED or a violet LED.

5. The LED assembly of claim 1, wherein the yellow-green phosphor comprises a garnet phosphor.

6. The LED assembly of claim 5, wherein the garnet phosphor comprises a yttrium aluminum garnet phosphor.

7. The LED assembly of claim 5, wherein the garnet phosphor comprises a yttrium aluminum garnet phosphor activated by cerium.

8. The LED assembly of claim 1, wherein the red phosphor comprises a manganese-doped potassium fluoro-silicate phosphor.

9. The LED assembly of claim 1, wherein the neodymium fluorine absorber comprises $NdF_3$.

10. The LED assembly of claim 1, wherein the neodymium fluorine absorber comprises a combination of $NdF_3$ and another neodymium compound.

11. The LED assembly of claim 1, wherein the neodymium fluorine absorber comprises a combination of $NdF_3$ and NdOF.

12. The LED assembly of claim 1, wherein the neodymium fluorine absorber comprises a combination of $NdF_3$ and $Nd_2O_3$.

13. The LED assembly of claim 1, wherein the neodymium fluorine absorber is configured to absorb yellow light in a range of approximately 560-610 nm.

14. The LED assembly of claim 1, wherein the yellow-green phosphor, red phosphor, and neodymium fluorine absorber combination comprises a yellow-green phosphor and red phosphor portion proximate the LED light source and a neodymium fluorine absorber portion spaced apart from the LED light source.

15. The LED assembly of claim 1, wherein the first correlated color temperature is approximately 4000 K, the first Lighting Preference Index is approximately 111, the second correlated color temperature is approximately 3500 K, and the second Lighting Preference Index is approximately 128.

16. The LED assembly of claim 1, wherein the first correlated color temperature is approximately 3350 K, the first Lighting Preference Index is approximately 107, the second correlated color temperature is approximately 3000 K, and the second Lighting Preference Index is approximately 120.

17. The LED assembly of claim 1, wherein the first correlated color temperature is approximately 3050 K, the first Lighting Preference Index is approximately 109, the second correlated color temperature is approximately 2755 K, and the second Lighting Preference Index is approximately 120.

18. The LED assembly of claim 1, wherein the yellow-green phosphor comprises between 0.3 and 0.7 mg of yttrium aluminum garnet phosphor activated by cerium.

19. The LED assembly of claim 1, wherein the red phosphor comprises between 1.0 and 2.0 mg of manganese-doped potassium fluoro-silicate phosphor.

20. The LED assembly of claim 1, wherein the neodymium fluorine absorber combination comprises between 0.05 and 0.15 mg of neodymium fluoride.

21. An LED assembly, comprising:
an LED light source having a first light output with a characteristic spectrum; and
a yellow-green phosphor, red phosphor, and neodymium fluorine absorber combination deposited on a top surface of the LED light source, wherein the first light output passes through the yellow-green phosphor, red phosphor and neodymium fluorine absorber combination,
wherein the yellow-green phosphor, red phosphor, and neodymium fluorine absorber combination consists of a yellow-green phosphor, a red phosphor and a neodymium fluorine absorber and is configured to convert the first light output to a second light output having a Lighting Preference Index greater than 110 and a correlated color temperature between 4000 K-2700 K.

* * * * *